United States Patent
Burr

[11] Patent Number: 5,998,850
[45] Date of Patent: Dec. 7, 1999

[54] TUNABLE FIELD PLATE

[75] Inventor: James B. Burr, Foster City, Calif.

[73] Assignee: Sun Microsystems, Inc., Palo Alto, Calif.

[21] Appl. No.: 09/028,457

[22] Filed: Feb. 24, 1998

[51] Int. Cl.[6] .................................................. H01L 27/14
[52] U.S. Cl. .......................... 257/428; 257/488; 257/630; 257/921
[58] Field of Search .................................. 257/297, 428, 257/429, 430, 488, 630, 660, 921

[56] References Cited

U.S. PATENT DOCUMENTS 3,896,309  7/1975  Halsor et al. ..................... 250/211 J
4,785,343  11/1988  Nezu .................................. 357/53
4,825,278  4/1989  Hillenius et al. .................. 357/53
4,937,756  6/1990  Hsu et al. .......................... 364/490
5,332,903  7/1994  Buehler et al. ................. 250/370.14

*Primary Examiner*—Sara Crane
*Attorney, Agent, or Firm*—Jones Volentine, LLP

[57] ABSTRACT

First and second semiconductor devices are separated by a field oxide on a semiconductor substrate, and a field plate is positioned over the field oxide. A leakage detector detects a field leakage current between the first and second semiconductor devices. A field plate generator tunes a potential of said field plate according to a magnitude of the field current detected by the leakage current detector. In this manner, field leakage is optimized, and total dose effects may be monitored for signs of device failure.

9 Claims, 2 Drawing Sheets

TUNABLE FIELD PLATE

BACKGROUND OF THE INVENTION

1. Field of the Invention

The present invention generally relates to semiconductor devices, and in particular, the present invention relates to a device and method for maintaining a field transistor in an off state notwithstanding long-term exposure of field oxides to radiation.

2. Description of the Related Art

FIG. 1 illustrates a somewhat typical configuration in which two n-channel MOS devices 101 and 102 are positioned side-by-side along the surface of a common bulk substrate 103. The device 101 includes an n-region source 104 and an n-region drain 105 defining a channel region therebetween. Positioned over the channel region of the device 101 are a gate oxide layer 106 and a gate electrode 107. Similarly, the device 102 includes a gate oxide layer 110 and a gate electrode 111 positioned over another channel region defined between an n-region drain 108 and an n-region source 109. The non-gated portion between the devices 101 and 102 is covered by a field-oxide 112. Typically, a number of metal overlays functioning as device interconnects will be positioned atop the field-oxides. Such an interconnect is shown by reference number 113 in FIG. 1.

As is apparent from FIG. 1, the n-regions 105 and 108, the field-oxide 112 and the metal overlay 113 together constitute the necessary parts of a transistor device. As such, if the potential of the overlay 113 exceeds a given potential, the intermediate region between the devices 101 and 102 will be inverted. In other words, a pseudo-channel will exist between the devices 101 and 102. In some operational states, the drain 105 of the device 101 and the drain 108 of the device 102 will be at different potentials. For example, the drain 105 may carry a logic 1 while the drain 108 is carrying a logic 0. In such a state, the presence of a pseudo-channel between the devices would result in substantial leakage.

To avoid this problem, the field-oxides are typically made much thicker than the gate-oxides in the device configuration, thereby increasing the absolute value of the threshold voltage in the field regions relative to that of the gated regions of the device. This prevents inversion of the field-oxide regions at potentials required for normal device operation.

However, notwithstanding the thick field-oxides, long-term exposure to radiation (which, for example, can occur in military and space applications) can reduce the field-oxide thresholds to the point where pseudo-channels are generated. Accumulation of charges in field-oxides can result, for example, from radiation exposure in the form of cosmic rays, solar winds, X-rays, and the like. The charge accumulations induced by such irradiation cause both an increase in the fixed charge within the field-oxide and an increase in the insulator-semiconductor interfacial-trap (or surface) concentration, which in turn can reduce the field region threshold voltage. This problem is especially acute for the relatively thick field-oxides which tend to accumulate more charges. In fact, it has been shown that the shift in threshold voltage for both the fixed charge and the interfacial traps is at least roughly proportional to the oxide thickness. The field-oxide may have a thickness on the order of 5000 Å, whereas the gate-oxide is typically around 50 Å. Thus, while the shift in gate voltage resulting from radiation might be only a few tens of millivolts for the gate regions, the impact on the field threshold shift might be one-hundred times greater.

A number of techniques are known for attempting to counter the effects of field threshold shifts induced by radiation. For example, one technique commonly used to offset the field threshold shift is to heavily dope the silicon surface. Analogous to a threshold adjust implant in the gate of a transistor, a field implant can be employed to shift the field threshold. A disadvantage of this approach is the increase in junction capacitance resulting from the heavy implant. Other techniques involve growing the oxide in such a way as to minimize charge trapping sites. That is, special techniques are sometimes employed to "harden" the oxides, i.e., to make the oxides less sensitive to incoming radiation.

Yet another technique which has been used to control field leakage (primarily in the days before the ion implantation approach) is the use of the "field plate". This is a conductive layer or plate placed above the silicon surface that acts like a common gate for all the field transistors. The plate is then held at a fixed potential to offset the field threshold voltage shift, and thus keep the field transistors in an off-state. That fixed potential could be something like −5 volts in the case of n-channel field transistors, and +5 volts in the case of p-channel field transistors. As such, one common plate would be provided for the n-channel field transistors, and a second common plate would be provided for the p-channel field transistors. An advantage of this approach is that it is not necessary to modify the part of the fabrication process involved in active device formation. Rather, the relatively simple addition of one or more conductive layers to form the field plates is all that is needed. On the other hand, one disadvantage of the field-plate approach is that the use of the relatively high fixed potentials results in a certain degree of constant power dissipation. Further, even in the presence of the fixed potentials, long-term exposure to excessive radiation can still create pseudo-channels in the field regions. Thus, the field transistors can be switched to an on-state without warning, making device failure imminent.

SUMMARY OF THE INVENTION

It is thus an object of the present invention to provide a semiconductor device structure and method which maintains a field transistor in an off state notwithstanding exposure of field oxides to radiation.

It is a further object of the present invention to provide a semiconductor device structure and method which optimizes a field potential applied to a field plate, to thereby minimizing power dissipation over time.

It is still a further object of the present invention to provide a semiconductor device structure and method which may be employed as a radiation monitor and early warning mechanism in cases where the device is subjected to long term exposure to radiation.

According to one aspect of the present invention, a semiconductor device is provided which includes first and second semiconductor regions of a first conductivity type separated by a field oxide on a semiconductor bulk of a second conductivity type; a field plate located over said field oxide; a leakage detector which detects a field leakage current between said first and second semiconductor regions; and a field plate generator which tunes a potential of said field plate according to a magnitude of the field current detected by said leakage current detector.

According to another aspect of the invention, the first semiconductor region is one of a source and a drain region of a first transistor, and the second region is one of a source and a drain region of a second transistor.

According to still another aspect of the present invention, the current detector includes a current mirror which receives a reference current and the field leakage current, and the field plate generator includes a comparator, having an output coupled to the field plate, which compares a potential across the current mirror with a reference potential.

According to still another aspect of the present invention, a method is provided which includes detecting a field leakage current between first and second semiconductor regions of a first conductivity type separated by a field oxide on a semiconductor bulk of a second conductivity type, and tuning a potential of a field plate located over said field oxide according to a magnitude of the field current detected by said leakage current detector.

According to another aspect of the present invention, the method further includes comparing the field leakage current with a reference current, and adjusting the potential of the field plate to minimize a difference between the field leakage current and the reference current.

BRIEF DESCRIPTION OF THE DRAWINGS

The above and other features and advantages of the present invention will become readily apparent from the description that follows, with reference to the accompanying drawings, in which.

DETAILED DESCRIPTION OF THE PREFERRED EMBODIMENTS

The present invention is directed to using a field plate to offset the field threshold voltage shift. However, rather than fixing the field plate potential as in the related art, according to the present invention the plate potential is tuned to optimize field leakage. Preferably, this is accomplished by measuring the leakage current between two drain regions (or a drain and a source region) separated by the minimum design rule spacing, with one at Vdd and the other at Gnd.

Figure 1:
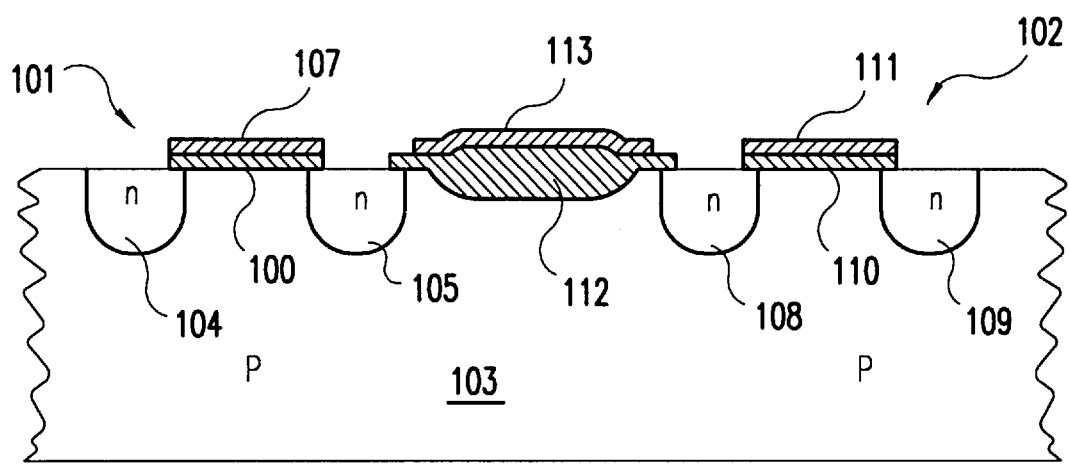
FIG. 1 illustrates a configuration in which n-channel MOS devices are separated by a field oxide.
Figure 2:
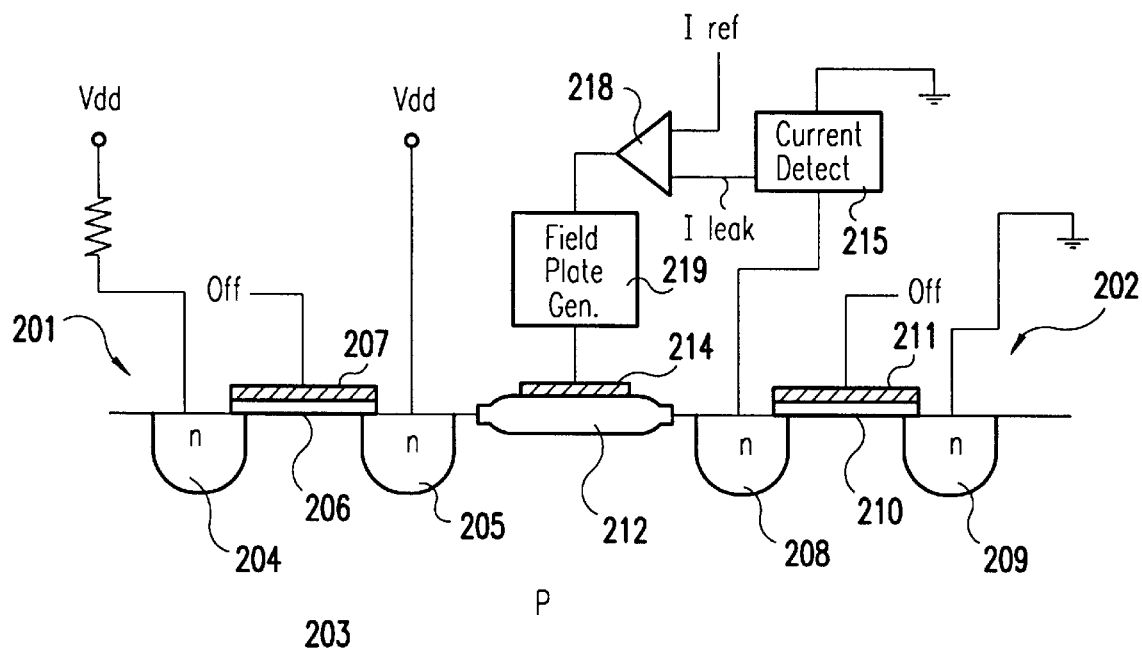
FIG. 2 illustrates a configuration according to an embodiment of the present invention in which a tunable field plate is positioned over the field oxide region.

FIG. 2 illustrates one embodiment of the present invention for tuning the field plate potential to optimize field leakage. Two n-channel MOS devices 201 and 202 are positioned side-by-side along the surface of a common bulk substrate 203. The device 201 includes an n-region source 204 and an n-region drain 205 defining a channel region therebetween. Positioned over the channel region of the device 201 are a gate oxide layer 206 and a gate electrode 207. Similarly, the device 202 includes a gate oxide layer 210 and a gate electrode 211 positioned over another channel region defined between an n-region drain 208 and an n-region source 209. The non-gated portion between the devices 201 and 202 is covered by a field-oxide 212. Reference numeral 214 denotes a field plate placed above the field oxide 212 so as to act like a common gate for all the n-channel field transistors (a separate field plate would be provided for the p-channel field transistors), and thus to keep the field transistors in an off-state. Although not shown, a number of insulating layers and metal overlays functioning as device interconnects may be positioned atop the field plate 214. It is noted that the width of the field plate need not span the entire width of the field oxide 212. Rather, the field plate need only be wide enough to effectively maintain the field transistor in an off-state.

The drain region 208 of the device 202 is grounded through a current detector 215, while the drain region 205 of the device 201 is tied to Vdd. A comparator 218 compares a reference current Iref (or a voltage indicative of Iref) with the current Ileak (or a voltage indicative of Ileak) detected by the current detector 215. As explained below, the output of the comparator drives a field plate potential generator 219 which in turn sets the potential of the field plate 214.

Each of the devices 201 and 202 is maintained in an off-state. As such, an off potential is applied to gates 207 and 211. In addition, to avoid leakage across the channels of the devices 201 and 202, the source and drain of each device is preferably kept at the same potential. For example, as shown, the drain region 208 and the source region 209 of device 202 may each be grounded, while the drain region 205 and the source region 204 may each be tied to Vdd.

In operation, the current detector 215 continually (or intermittently, as described later) monitors any leakage across the channel of the field transistor. That is, since device 201 is in an off-state, and since the source 204 and drain 205 are at the same potential, any current detected by the detector 215 is attributed to leakage across the field channel from the drain 205 to the drain 208. In the event that the leakage Ileak exceeds Iref as indicated by the output of the comparator 218, the field plate generator 219 increases an absolute potential applied to the field plate 214 to thereby offset any decrease in the field threshold caused by total dose effects. In other words, the difference between the field threshold potential and the plate potential is maintained at a satisfactory level, to thereby keep Ileak at Iref. Conversely, particularly upon device initialization, if the leakage Ileak is less than Iref as indicated by the output of the comparator 218, the field plate generator 219 may decrease the absolute potential applied to the field plate 214. In this case, setting of the field plate potential at an unnecessarily high level is avoided, thus conserving energy. Decreasing the field plate absolute potential may also occur in the case where the field leakage is transient. This can happen in the situation where a high concentration trap charge dissipates over time. As such, the potential of the field plate 214 would temporarily be elevated for the duration of the resultant spike in field leakage.

In addition, the output of the current detector may be usefully employed as a radiation monitor and early warning mechanism. For example, the field plate generator will typically have a maximum output potential, e.g. ±5volts. Monitoring of the leakage current allows for a calculation of the rate of degradation, as well as an estimated time of failure. It also provides active feedback about the radiation environment of the device. A higher than expected total dose effect can be readily detected, allowing for risk assessments and modifications of any experiments being conducted. This would be particularly useful in space applications and the like.

Figure 3:
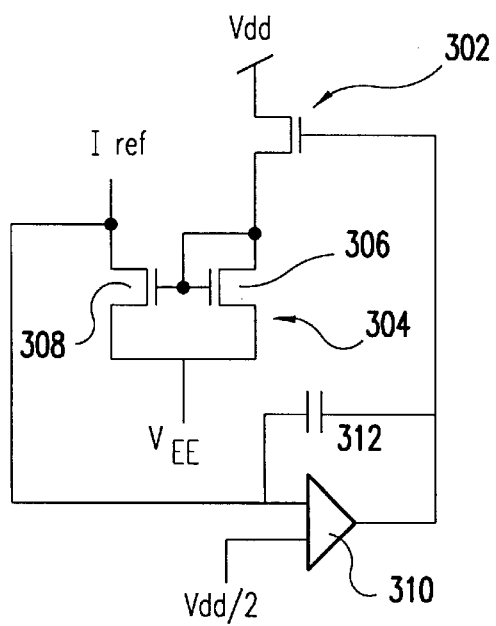
FIG. 3 is a diagram for describing, by way of example only, circuitry which may be used to control a field plate potential according to the present invention.

FIG. 3 is a diagram for describing, by way of example only, circuitry which may be used to control the field plate potential. Reference number 302 is the field oxide transistor, with the gate thereof being constituted by the field plate 214 shown in FIG. 2. Vdd is connected to one end of the field transistor 302, and a current mirror 304 is connected to the other end thereof as shown. The current mirror 304 is formed by matched transistors 306 and 308, with transistor 308 receiving the reference current Iref. (It is noted another current mirror, not shown, may be used to supply the reference current Iref.) Reference number 310 is a comparator for comparing the voltage drop across transistor 308 with a reference value, such as Vdd/2. Reference number 312 is a smoothing capacitor.

In operation, as the leakage current of the field transistor increases (or decreases), the voltage drop across transistor 306 increases (or decreases), which in turn increases (or decreases) the voltage drop across matched transistor 308. The comparator 310 output is increased (or decreased) in response to the imbalance between Vdd/2 and the voltage across transistor 308, thereby adjusting the base potential (i.e., the field plate potential) of the field transistor 302.

As explained above, the technique of the present invention at least partially resides in tuning the field plate potential to optimize field leakage. In this respect, the present invention has been described by way of specific exemplary embodiments, and the many features and advantages of the present invention are apparent from the written description. As one example only, it is not necessary that the field leakage be measured across adjacent transistors. Rather, all that is needed are n-type (or p-type) regions positioned on opposite sides of a field oxide to thereby form a field transistor. Also, rather than simply a pair of field plates for the NFETs and PFETs, multiple field plates with multiple respective tuning circuits may be provided for each of the different functional circuit units on the chip. Thus, it is intended that the appended claims cover all such features and advantages of the invention.

Moreover, as total dose effects generally occur over very long time intervals (minutes to days), in many cases it will only be necessary to adjust the field plate voltage very infrequently. The leakage detection circuit can be enabled briefly, the plate voltage adjusted, then the system can be put back to sleep. This measurement could be done, for example, once a day, and need only take a few microseconds. On the other hand, if transient effects are deemed important, then the leakage monitoring would be continuous (or nearly continuous), and the response would be relatively fast.

Further, radiation effects are granular and may not affect all parts of the chip equally. It may thus be desirable to distribute field leakage measurement circuitry throughout the chip, placing the circuits near regions that are especially susceptible because the transistors are tightly packed. It may also be desirable to have different field plate voltages depending on how closely packed the transistors are (the closer the packing, the lower the field threshold).

Still further, it may be desirable to have a different field plate voltage source for each functional unit which might be powered down separately. This is because it is unnecessary to maintain a field transistor in the off state if its source and drain are at the same potential.

Also, it is sometimes possible to purge trapped charge by temporarily elevating the field plate voltage. The system could be put through a purge cycle whenever the plate voltage exceeded a certain value. Moreover, due to time scales involved, field leakage current measurement and field plate voltage adjustment could be placed under software control, permitting arbitrarily sophisticated field leakage control algorithms to be employed.

Since numerous modifications and changes will readily occur to those skilled in the art, it is not desired to limit the invention to the exact construction and operation as illustrated and described. Hence all suitable modifications and equivalents may be resorted to as falling with the scope of the invention.

What is claimed is:

1. A semiconductor circuit comprising:
   first and second semiconductor regions of a first conductivity type separated by a field oxide on a semiconductor bulk of a second conductivity type;
   a field plate located over said field oxide;
   a leakage detector which detects a field leakage current between said first and second semiconductor regions; and,
   a field plate generator which tunes a potential of said field plate according to a magnitude of the field current detected by said leakage current detector.

2. A semiconductor circuit as claimed in claim 1, wherein said first semiconductor region is one of a source and a drain region of a first transistor, and said second region is one of a source and a drain region of a second transistor.

3. A semiconductor circuit as claimed in claim 2, wherein a gate of each of said first and second transistors has an off-potential applied thereto.

4. A semiconductor circuit as claimed in claim 1, wherein said first semiconductor region is tied to a supply voltage and said second semiconductor region is grounded.

5. A semiconductor circuit as claimed in claim 3, wherein said first semiconductor region is tied to a supply voltage and said second semiconductor region is grounded.

6. A semiconductor circuit as claimed in claim 1, wherein said current detector includes a current mirror which receives a reference current and the field leakage current, and wherein said field plate generator includes a comparator, having an output coupled to said field plate, which compares an potential across said current mirror with a reference potential.

7. A semiconductor device comprising multiple functional circuit units in a semiconductor chip, and multiple semiconductor circuits provided within respective ones of said multiple functional circuit units, each of said semiconductor circuits comprising:
   first and second semiconductor regions of a first conductivity type separated by a field oxide on a semiconductor bulk of a second conductivity type;
   a field plate located over said field oxide;
   a leakage detector which detects a field leakage current between said first and second semiconductor regions; and,
   a field plate generator which tunes a potential of said field plate according to a magnitude of the field current detected by said leakage current detector.

8. A method for countering total dose effects in a semiconductor device, comprising:
   detecting a field leakage current between first and second semiconductor regions of a first conductivity type separated by a field oxide on a semiconductor bulk of a second conductivity type; and,
   tuning a potential of a field plate located over said field oxide according to a magnitude of the field current detected by said leakage current detector.

9. A method as claimed in claim 8, further comprising comparing the field leakage current with a reference current, and adjusting the potential of the field plate to minimize a difference between the field leakage current and the reference current.

* * * * *